United States Patent
Watanabe et al.

(10) Patent No.: US 8,642,449 B2
(45) Date of Patent: Feb. 4, 2014

(54) SILICON WAFER

(75) Inventors: Takashi Watanabe, Tokyo (JP); Ryuji Takeda, Niigata (JP)

(73) Assignee: Globalwafers Japan Co., Ltd., Kitakanbara-gun (JP)

(*) Notice: Subject to any disclaimer, the term of this patent is extended or adjusted under 35 U.S.C. 154(b) by 397 days.

(21) Appl. No.: 12/940,754

(22) Filed: Nov. 5, 2010

(65) Prior Publication Data

US 2011/0053350 A1 Mar. 3, 2011

Related U.S. Application Data

(62) Division of application No. 12/404,740, filed on Mar. 16, 2009, now abandoned.

(30) Foreign Application Priority Data

Mar. 21, 2008 (JP) .................................. 2008-073260

(51) Int. Cl.
| | |
|---|---|
| H01L 21/322 | (2006.01) |
| H01L 21/20 | (2006.01) |
| H01L 21/36 | (2006.01) |
| H01L 33/00 | (2010.01) |
| H01B 1/12 | (2006.01) |
| C30B 15/00 | (2006.01) |
| C30B 21/06 | (2006.01) |
| C30B 27/02 | (2006.01) |
| C30B 28/10 | (2006.01) |
| C30B 30/04 | (2006.01) |
| C30B 23/00 | (2006.01) |
| C30B 25/00 | (2006.01) |
| C30B 28/12 | (2006.01) |
| C30B 28/14 | (2006.01) |

(52) U.S. Cl.
USPC ............ 438/473; 438/471; 438/509; 117/13; 117/84; 252/500; 257/E21.318

(58) Field of Classification Search
USPC ...................... 438/509, 471, 473; 117/13, 84; 252/500; 257/E21.318
See application file for complete search history.

(56) References Cited

U.S. PATENT DOCUMENTS

| 6,805,743 B2* | 10/2004 | Kobayashi et al. ............. 117/89 |
| 2003/0192469 A1* | 10/2003 | Libbert et al. ..................... 117/2 |
| 2005/0250297 A1* | 11/2005 | Shive et al. .................... 438/471 |
| 2007/0224783 A1* | 9/2007 | Falster et al. ................. 438/471 |

FOREIGN PATENT DOCUMENTS

| JP | 09-17800 A | 1/1997 |
| JP | 3171308 B2 | 3/2001 |
| JP | 2006-188423 A | 7/2006 |

OTHER PUBLICATIONS

Norihiko Tsuchiya et al., "The Origin of Extended Dislocation Induced by High-Dose Ion Implantation", IEEE Transactions on Semiconductor Manufacturing, vol. 18, No. 1, Feb. 2005, pp. 19-25.

* cited by examiner

Primary Examiner — Harold Pyon
Assistant Examiner — Tanisha Diggs
(74) Attorney, Agent, or Firm — Foley & Lardner LLP

(57) ABSTRACT

A silicon wafer which has DZ layers formed on both sides thereof by heat treatment in an atmosphere of reducing gas (such as hydrogen) or rare gas (such as argon) with a specific temperature profile for heating, holding, and cooling, and which also has a gettering site of BMD in the bulk inside the DZ layer. A silicon wafer which has a silicon epitaxial layer formed on one side thereof. The DZ layer and the silicon epitaxial layer contain dissolved oxygen introduced into their surface parts, with the concentration and distribution of dissolved oxygen properly controlled. Introduction of oxygen into the surface part is accomplished by heat treatment and ensuing rapid cooling in an atmosphere of oxygen-containing gas.

6 Claims, 7 Drawing Sheets

SILICON WAFER

CROSS-REFERENCE TO RELATED APPLICATIONS

This application is a Divisional of U.S. application Ser. No. 12/404,740, filed Mar. 16, 2009, which is based upon and claims the benefit of priority from prior Japanese Patent Application No. 2008-073260, filed Mar. 21, 2008, the entire contents of which are incorporated herein by reference.

BACKGROUND OF THE INVENTION

1. Field of the Invention

The present invention relates to a silicon wafer to be used for production of semiconductor devices. More particularly, the present invention relates to a silicon wafer composed of a surface layer and an internal layer, the former for active device region having high-quality crystallinity and high stress resistance, and the latter being highly capable of gettering metal contaminants.

2. Description of the Related Art

Semiconductor devices remarkably advancing in integration, performance, and function need a finer design rule, say 65-45 nm, than before for their elements or constituents. Such semiconductor devices are formed on a substrate which is a silicon water produced by crystal pulling method such as Czochralski method (CZ) or magnetic field applied Czochralski method (MCZ).

Silicon wafers need the gettering of metal contaminants in trace amounts coming into them during device fabrication so that devices have improved yields and reliability. Therefore, it is highly necessary for them to have the active region for devices which is limited in aggregates of point detects, such as lattice vacancies, and precipitates of interstitial oxygen, such as bulk micro defects (BMD). The aggregates of point detects include crystal originated particles (COP) and laser scattering tomography defects (LSTD). BMD denotes minute amorphous silicon oxide in octahedral form.

A conventional way of gettering metal contaminants is by extrinsic gettering method (EG), which permits metal contaminants to be captured by a backside damage layer, backside polysilicon layer, or phosphorus impurity diffusion layer. A new way of gettering metal contaminants is by intrinsic gettering method (IG), which employs a gettering site formed in the bulk of the silicon wafer. Now, this IG method is popular for production of semiconductor devices.

The IG method for the silicon wafer prepared by CZ or MCZ method includes heat treatment that causes supersaturated interstitial oxygen remaining in the silicon wafer to separate out, thereby forming BMD in the bulk of the silicon wafer, inducing secondary dislocations and stacking faults around them, and utilizing the precipitates and their surrounding as the gettering site for metal contaminants. This method requires that the occurrence of BMD be prevented in the surface layer as the device active region.

There have been proposed several methods for preparing silicon wafers with IG effect. These methods involve heat treatment that controls precipitation of supersaturated interstitial oxygen, adjusts precipitating nuclei, dissolution of precipitates and precipitating nuclei, and diffusion of interstitial oxygen. High-temperature heat treatment at 1100 to 1300° C., for example, causes precipitating nuclei to diminish or disappear. Such heat treatment also causes oxygen to diffuse outward from the surface layer of the silicon wafer, thereby forming the denuded zone (DZ), which is a defect-free layer containing a very small amount of BMD in the device active region. Low-temperature heat treatment at 500-900° C., for example, forms precipitating nuclei which are uniform in size and density. Middle-temperature heat treatment at about 1000° C., for example, controls the growth of BMD and secondary defects or controls the dissolution of certain precipitates.

The phenomenon of BMD formation is regarded as equivalent to condensation of supersaturated gas into liquid drops. It may be discussed in terms of condensation of supersaturated oxygen in a silicon wafer according to thermal equilibrium based on statistical thermodynamics, which will be briefly mentioned below. Condensation of supersaturated oxygen may be regarded as proceeding in such a way that Helmholtz free energy becomes minimal in the thermal system. Helmholtz free energy in the thermal system may be regarded approximately as the sum of free energy of BMD and free energy of oxygen dissolving in a silicon wafer. The free energy of BMD includes its internal energy, surface energy, stress field energy, electric field energy, and temperature-entropy product. Here, entropy is obtained from the quantity of state involved in the distribution of thermal energies. The free energy may also be derived from the partition function of thermal canonical distribution.

Elucidation of BMD formation reveals that the free energy of BMD depends on the diameter of BMD and there exists a critical nucleus diameter for which the free energy of BMD becomes maximal. BMD smaller than the crystal nucleus diameter at a certain temperature dissolves to diminish or disappear. However, BMD grows in the opposite case, so that the thermal system takes on a minimal free energy. Here, the critical nucleus diameter increases in proportion to the temperature of heat treatment, and it depends on the degree of supersaturation of oxygen.

It is considered that BMD formation makes oxygen clusters in a silicon wafer uniform nuclei. Other impurities such as nitrogen (N) and carbon (C), which lower the free energy of BMD, and lattice vacancies also function as precipitating nuclei. Moreover, p-type or n-type impurities in a silicon wafer become activated to create the electric field energy, thereby affecting oxygen precipitation. Thus, one way to prepare a silicon wafer having the IG effect mentioned above is by adding such impurities as N and C or by controlling the freezing of lattice vacancies during heat treatment. There has also been proposed a method of controlling the rate of heating up to the heat treatment temperature or the rate of cooling from the heat treatment temperature in considering that the critical nucleus diameter of BMD increases at a rate that depends on temperature and in considering the substantial growth rate of BMD. Some of these methods are in practical use.

Among the above-mentioned methods for preparing silicon wafers having the IG effect is the one which is intended to form adequate BMD in the bulk of a silicon wafer and to disappear aggregates of lattice vacancies as grown-in defects in the DZ layer mentioned above, thereby improving the quality of the silicon wafer. (See Japanese Patent No. 3171308.) This method is characterized in that the high-temperature heat treatment is carried out in a reducing gas, such as hydrogen ($H_2$), or an inert gas, such as argon, which removes the oxide layer ($SiO_x$ layer) that occurs on the inside wall of the cavity of the aggregates, thereby effectively disappearing aggregates. The silicon wafer prepared in this manner will be referred to as anneal wafer hereinafter.

According to another method proposed so far, the silicon wafer is processed in such a way that it permits adequate BMD to form in its bulk and it undergoes silicon epitaxial growth, so that the silicon epitaxial layer with good crystallinity is used as the device active region. (See Japanese Patent Laid-open No. 2006-188423.) The silicon wafer prepared by this method will be referred to as an epitaxial wafer with IG treatment.

In the meantime, the microstructure of semiconductor elements intended for high integration, high performance, and high function increases stress in the surface layer of a silicon wafer. Typical of such stresses are one that occurs around the fine pattern constituting MISFET and one that is accompanied by residual stress resulting from ion implantation with n-type or p-type impurity. (See IEEE Transaction on Semiconductor Manufacturing, February 2005, vol. 18, No. 1, p. 19-25.)

The manufacturing process for such devices tends toward temperature reduction and time saving. For example, it has become common to carry out heat treatment in the diffusion furnace at a temperature lower than 1000° C. Another example of temperature reduction is replacement of rapid thermal annealing (RTA), which has been common in thermal process in fabrication of semiconductor devices, by low thermal budget heat treatment such as flash lamp annealing and laser spike annealing. Incidentally, RTA is annealing by irradiation with halogen lamp rays, which lasts for several seconds to ten-odds seconds. By contrast, the low thermal budget mentioned above merely takes a very short time, say a few milliseconds. Such device fabrication process involves difficulties in relieving by heat treatment the stresses which increase as the semiconductor elements become finer. Moreover, heat treatment by low thermal budget with rapid temperature rise and fall causes thermal stress to increase in the surface layer of a silicon wafer.

The recent trend in semiconductor devices and fabrication process mentioned above results in the anneal wafer and epitaxial wafer with IG treatment inevitably decreasing in the concentration of dissolved oxygen in the surface layer of the wafer. This situation leads to defects such as dislocation due to increased stresses in the surface layer of the wafer, and these defects easily propagate. Thus, anneal wafers and epitaxial wafers with IG treatment are suffering the disadvantage that the yield of semiconductor devices decreases due to increased stresses in the surface layer of the wafer. The device fabrication process that is performed at a lower temperature in a shorter time does not compensate for dissolved oxygen in the surface layer of the wafer during device fabrication. This problem is encountered also by silicon epitaxial wafers without IG treatment.

In order to cope with the finer device structure, which increases stresses in the surface layer of the wafer, and the device fabrication process, which is performed at a lower temperature in a shorter time, there has arisen a demand for a silicon wafer which permits an adequate amount of oxygen to dissolve in the surface layer of the wafer before the wafer passes through the device fabrication process and which prevents the occurrence of dislocations and is capable of pinning dislocations.

SUMMARY OF THE INVENTION

It is an object of the present invention to provide a silicon wafer (such as anneal wafer and epitaxial wafer) which has an adequately controlled concentration of dissolved oxygen in its surface layer before it undergoes the device fabrication process.

It is another object of the present invention to provide a silicon wafer whose surface layer has good crystallinity and high stress resistance and whose internal part is highly capable of gettering metal contaminants.

According to one mode of the present invention, the silicon wafer is one which has undergone heat treatment after slicing from a single-crystal silicon ingot grown by pulling. This heat treatment is carried out at 1100 to 1300° C. in an atmosphere of reducing gas or inert gas or a mixture thereof. It gives rise to the DZ layer in the surface of the silicon wafer and an adequate amount of BMD in the internal part under the DZ layer. The surface part of the DZ layer contains oxygen so that the concentration of dissolved oxygen therein is no lower than $1\times10^{17}$ atoms/cm$^3$.

According to another mode of the present invention, the silicon wafer is one which has a silicon epitaxial layer formed on a silicon wafer after slicing from a single-crystal silicon ingot grown by pulling. The silicon epitaxial layer contains oxygen such that the concentration of dissolved oxygen in its surface is no lower than $1\times10^{17}$ atoms/cm$^3$.

According to a preferred mode of the present invention, dissolved oxygen is distributed such that its concentration is minimal in the depth down to 2 μm from the surface of the silicon wafer, and the density of BMD is no higher than $2.5\times10^7$ pieces/cm$^3$.

The concentration of dissolved oxygen in the depth down to 2 μm from the surface of the silicon wafer is in the range of 1.2 to $6.0\times10^{17}$ atoms/cm$^3$, and the concentration of dissolved oxygen in the depth down to 9 μm from the surface of the silicon wafer is in the range of 2.8 to $5.2\times10^{17}$ atoms/cm$^3$.

Introduction of oxygen into the surface part of the DZ layer or into the surface part of the silicon epitaxial layer is accomplished by heat treatment in an oxygen-containing gas and ensuing rapid cooling.

The silicon wafer according to the present invention has limited dislocations in its surface layer and is highly capable of pinning dislocations because it undergoes annealing or epitaxial growth before it passes through the process of semiconductor device fabrication so that its surface part contains dissolved oxygen in an adequate concentration.

BRIEF DESCRIPTION OF THE DRAWINGS

Embodiments of the present invention will be described in detail based on the following figures, wherein.

DESCRIPTION OF THE PREFERRED EMBODIMENTS

Figure 1:
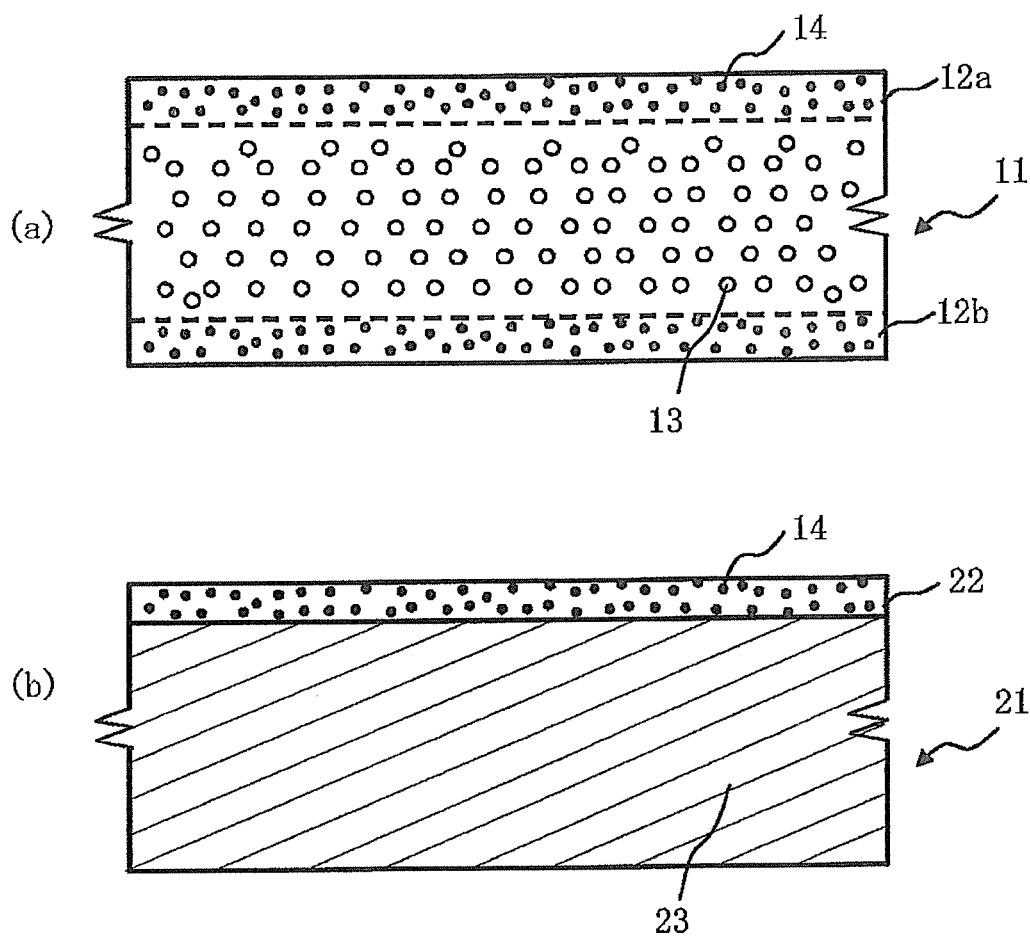
FIG. 1A is a sectional view showing an anneal wafer pertaining to the embodiment of the present invention.
FIG. 1B is a sectional views showing an epitaxial wafer pertaining to the embodiment of the present invention.

The embodiments according to the present invention will be described below with reference to FIGS. 1A to 5.

The silicon wafer 11 (or anneal wafer) shown in FIG. 1A has the DZ layers 12a and 12b on both sides thereof. (The DZ layers 12a and 12b will be collectively referred to as DZ layer 12 hereinafter.) The DZ layer 12 is formed by heat treatment in an atmosphere of reducing gas, such as hydrogen ($H_2$), or an inert gas, such as argon (Ar), or a mixture thereof. The heat treatment consists of heating, holding, and cooling steps as detailed later. The silicon wafer also has the gettering site 13 of BMD inside the DZ layer 12. The DZ layer 12 contains in its surface part dissolved oxygen 14 whose concentration and distribution are adequately controlled.

The silicon wafer 21 (or epitaxial wafer) shown in FIG. 1B has the silicon epitaxial layer 22 on one side thereof. The silicon epitaxial layer 22 contains in its surface part dissolved oxygen 14 whose concentration is adequately controlled. Incidentally, the silicon wafer 21 may contain in its bulk part 23 the gettering site for relaxation-induced gettering which is BMD formed by IG treatment described in the section of related art. Also, the silicon epitaxial wafer may be one which has the EG effect or one which has the $p/p^+$ structure for segregation-induced gettering.

Figure 2:
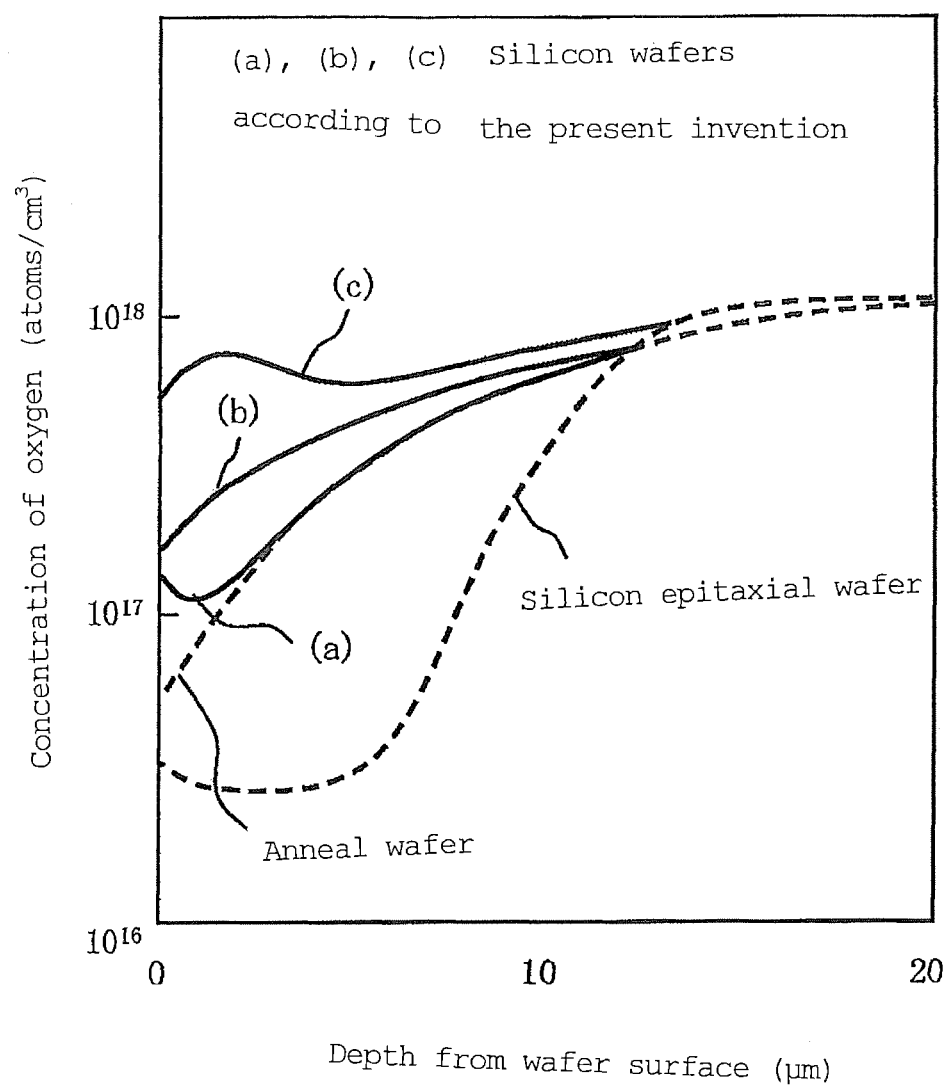
FIG. 2 is a graph showing a distribution of the concentration of dissolved oxygen in the depthwise direction of the silicon wafer pertaining to the embodiment of the present invention.

The DZ layer 12 or the silicon epitaxial layer 22 contains in its surface part dissolved oxygen 14 such that its concentration is no lower than $1 \times 10^{17}$ atoms/cm$^3$, as shown in FIG. 2. The abscissa in FIG. 2 represents the depth from the surface of the silicon wafer 11 or 21, and the ordinate in FIG. 2 represents the concentration of dissolved oxygen. The dotted line in FIG. 2 represents the general distribution of oxygen concentration in the anneal wafer in related art, and the broken line in FIG. 2 represents the general distribution of oxygen concentration in the silicon epitaxial wafer. The oxygen concentration in either cases is of the order of $10^{16}$ atoms/cm$^3$. The actual oxygen concentration in anneal wafer and epitaxial wafer is $6 \times 10^{16}$ atoms/cm$^3$ and $3 \times 10^{16}$ atoms/cm$^3$, respectively, which is determined by secondary ion mass spectrometry (SIMS).

The dissolved oxygen 14 has its concentration and depthwise distribution properly controlled. The solid line (a) in FIG. 2 indicates that the concentration of the dissolved oxygen 14 has a minimum in the region from the wafer surface to the depth of 2 μm and increases monotonously in the region from the depth of 2 μm to the depth of 20 μm and finally reaches the value of $1 \times 10^{18}$ atoms/cm$^3$ in the bulk part. By contrast, the solid line (b) in FIG. 2 indicates that the concentration of the dissolved oxygen 14 monotonously increases in the region from the wafer surface to the depth of 20 μm and reaches the value of $1 \times 10^{18}$ atoms/cm$^3$ in the bulk part. Also, the solid line (c) in FIG. 2 indicates that the concentration of the dissolved oxygen 14 increases in the region from the wafer surface to the depth of 2 μm and monotonously increases thereafter with a minimum and a maximum to the depth of 20 μm and finally reaches the value of $1 \times 10^{18}$ atoms/cm$^3$ in the bulk part.

The dissolved oxygen 14 should preferably be distributed as indicated by the solid line (a) in FIG. 2 such that there exists a minimum in the region from the surface of the silicon wafer 11 or 21 to the depth of 2 μm. The concentration of dissolved oxygen should desirably be 1.2 to $6.0 \times 10^{17}$ atoms/cm$^3$ in the region from the surface of the silicon wafer to the depth of 2 μm and 2.8 to $5.2 \times 10^{17}$ atoms/cm$^3$ in the region from the surface of the silicon wafer to the depth of 9 μm.

The finished silicon wafer 11 or 21 has a density of BMD (larger than 20 nm) no higher than $2.5 \times 10^7$ pieces/cm$^3$ in the region from the surface to the depth of 2 μm. The density of BMD of this order has no adverse effect on the performance of semiconductor devices. In addition, it effectively prevents dislocations from occurring and propagating in the well layer for semiconductor devices formed in the depth of 0.3 μm or less from the surface of the silicon wafer.

The dissolved oxygen 14 may have its concentration and depthwise distribution adjusted and controlled in various ways. The following is a detailed description of the process for producing the anneal wafer and silicon epitaxial wafer to be made into the silicon wafer 11 or 21 and the method for injecting dissolved oxygen 14 into them and controlling the concentration of dissolved oxygen 14 in them.

(Preparation of Anneal Wafer)

The anneal wafer is prepared from a silicon wafer sliced from a single-crystal silicon ingot pulled and grown by the CZ method. It has both sides or one side thereof mirror-polished. It contains oxygen in crystals such that the concentration of interstitial oxygen (Oi) is 1.0 to $1.8 \times 10^{18}$ atoms/cm$^3$.

Figure 3:
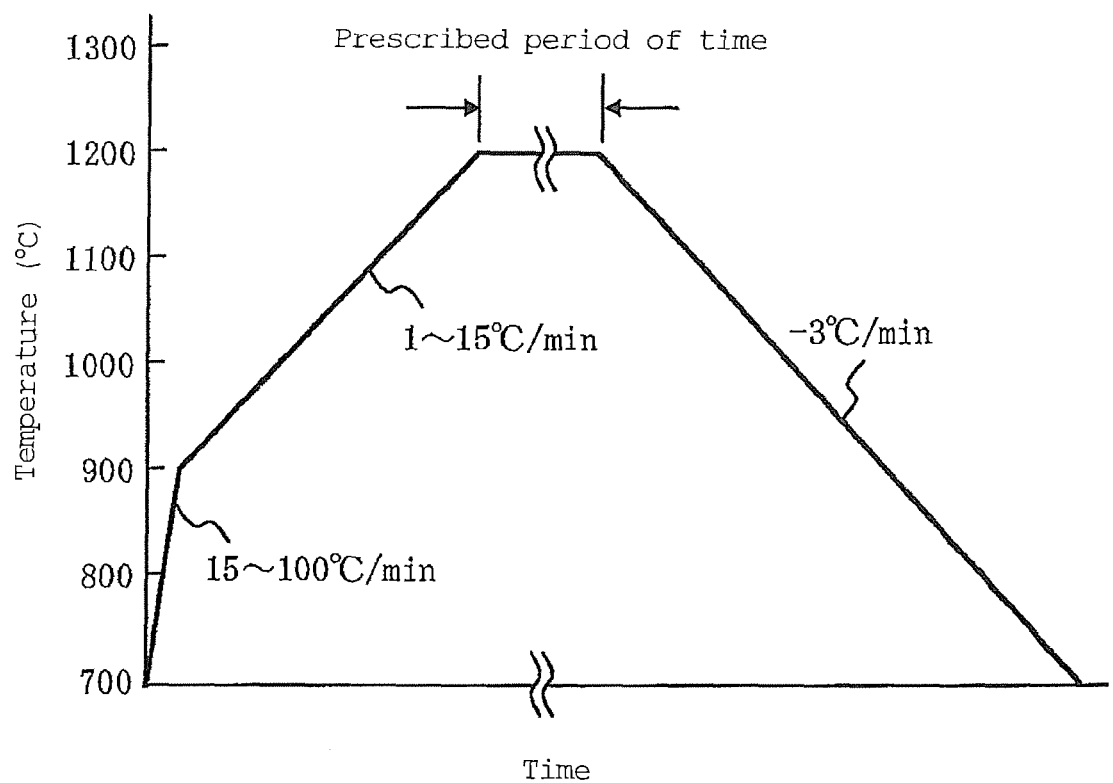
FIG. 3 is a diagram showing one example of the temperature profile in heat treatment employed for preparation of the anneal wafer according to the embodiment of the present invention.

For preparation of anneal wafers, a number of raw silicon wafers are placed in a horizontal or vertical diffusion furnace for batchwise heat treatment with temperature change as shown in FIG. 3. The heat treatment is carried out in an atmosphere of reducing gas, such as hydrogen ($H_2$), or inert gas, such as argon (Ar), or a mixture thereof. The heat treatment includes three stages of controlled heating, predetermined holding, and controlled cooling.

Incidentally, the reducing gas may also be a hydrogen compound gas, such as $NH_3$ and $N_2H_2$, and the inert gas may also be helium, neon, or krypton.

The heat treatment is carried out according to the temperature profile shown in FIG. 3. The temperature is raised from room temperature to 900° C. at a rate of 5 to 100° C./min. The temperature is raised from 900° C. to 1200° C. at a rate of 1 to 15° C./min. The temperature is kept constant at 1100° C. to 1300° C. for 1 minute to 48 hours. Finally, the temperature is lowered down to 700° C. at a rate of 3° C./min.

Ordinary heating causes BMD to increase in critical nucleus diameter with temperature. However, adequately controlled heating mentioned above causes BMD to diminish and disappear and precipitating nuclei to be formed by low-temperature heat treatment as explained in the section of related art. The heat treatment at an intermediate temperature causes BMD to grow in the bulk and causes oxygen to diffuse outward in the surface layer, thereby reducing oxygen concentration.

The temperature holding stage causes more oxygen to diffuse outward from the surface layer, thereby accelerating disappearance of BMD. It also effectively eliminates aggregates of lattice vacancies (which are grown-in defects) remaining in the surface layer, thereby resulting in the DZ layer with high crystallinity.

During this stage, oxygen diffuses in the bulk of the wafer, thereby causing BMD to shrink; however, oxygen reduction is not enough to completely eliminate BMD.

In the cooling stage, BMD should theoretically grow in the surface layer, too, on account of the low cooling rate; in actual, however, BMD does not form but the DZ layer forms because oxygen decreases due to its outward diffusion. By contrast, BMD precipitates and grows again in the bulk. Thus, the DZ layer forms on both sides of the wafer and BMD of desired density forms in the bulk.

An adequate control is imposed so that the DZ layers 12a and 12b shown in FIG. 1A have a thickness of about 10 μm, have a density of BMD (larger than 20 nm) no higher than $10^7$ pieces/cm$^3$, and contain as much dissolved oxygen as about $10^{16}$ atoms/cm$^3$.

The resulting anneal wafer has the BMD density of $5 \times 10^8$ to $5 \times 10^9$ pieces/cm$^3$ in its bulk and has the gettering site 13 composed of BMD and its surrounding secondary dislocations and laminate defects. With a BMD density lower than $5 \times 10^8$ pieces/cm$^3$ in the bulk, the anneal wafer does not fully produce the effect of gettering metal contaminants in the fabrication process of semiconductor devices. On the other hand, with a BMD density higher than $5 \times 10^9$ pieces/cm$^3$, the anneal wafer remarkably suffers warpage.

(Preparation of Silicon Epitaxial Wafer)

The silicon epitaxial wafer is prepared by growing the silicon epitaxial layer 22 (about 10 μm thick) on the surface of the raw silicon wafer as shown in FIG. 1B by chemical vapor deposition (CVD).

The CVD for epitaxial growth to form the silicon epitaxial layer employs a feed gas such as $SiH_4$, $SiH_2Cl_2$, $SiHCl_3$, and $SiCl_4$ at normal pressure or reduced pressure. The CVD also employs $H_2$ gas as a diluent gas and $PH_3$ or $B_2H_6$ as a dopant gas. The temperature for CVD is adjusted to 1000 to 1250° C.

The epitaxial growth may be accomplished in such a way that the resulting silicon epitaxial layer is identical with or different from the silicon substrate in conduction type (p/p$^+$ or n/n$^+$, for example).

Incidentally, the epitaxial wafer with IG treatment may be prepared from the anneal wafer with IG treatment which has been explained above with reference to FIG. 3. Alternatively, the IG treatment may be accomplished by an adequate combination of heat treatments at a high temperature, medium temperature, and low temperature, as explained above in the section of related art, so that the gettering site of BMD is formed as much as necessary in the bulk of the silicon wafer. In this case, the DZ layer may be very small or null. The IG treatment at a high temperature may be accomplished in an atmosphere of oxidizing gas including diluted oxygen. It is also possible to use a raw silicon wafer which contains an adequate amount of impurities such as N and C which function as precipitating nuclei for BMD, as explained above in the section of related art. This technique is intended to reduce the possibility that precipitating nuclei diminish in the course of epitaxial growth. The foregoing procedure for IG treatment differs from that employed to prepare the anneal wafer.

The silicon epitaxial wafer has the silicon epitaxial layer 22, shown in FIG. 1B, which contains dissolved oxygen in an amount of the order of $10^{16}$ atoms/cm$^3$. Also, the resulting silicon epitaxial layer 22 is a high-quality crystalline layer free of COP (aggregates of lattice vacancies).

(Injection and Concentration Control of Dissolved Oxygen)

Below is described how to inject dissolved oxygen into the outer part of the DZ layer 12 of the anneal wafer or the outer part of the silicon epitaxial layer 22 of the silicon epitaxial wafer and how to adjust and control the dissolved oxygen. The outer part is the device active region as explained above in the section of related art. It denotes the region about 5 μm deep from the surface of the wafer, with the depth varying depending on the type of the semiconductor device. The injection and concentration control of dissolved oxygen may be accomplished in various ways as illustrated in the following.

(1) Method for Isothermal Heat Treatment and Rapid High-temperature Treatment

Figure 4:
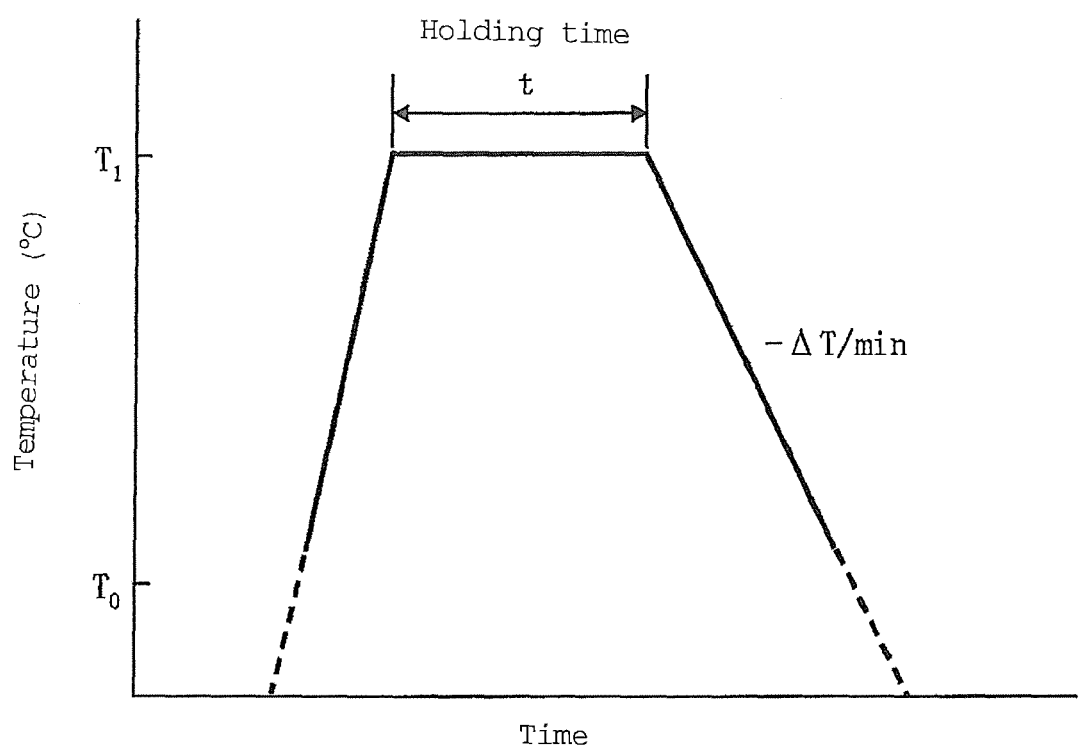
FIG. 4 is a diagram showing one example of the temperature profile in heat treatment employed for oxygen injection and control of oxygen concentration in the surface layer of the silicon wafer according to the embodiment of the present invention.

This method is intended for the anneal wafer or silicon epitaxial wafer to undergo heat treatment in a furnace capable of rapid cooling with a temperature profile shown in FIG. 4. The furnace performs isothermal heat treatment and subsequent rapid cooling in an atmosphere of oxygen ($O_2$), diluted oxygen with rare gas or inert gas such as nitrogen, or oxygen-containing gas such as $H_2O$, $NO_2$, and NO. The atmosphere in the heat treatment furnace may be decompressed or pressurized. The heat treatment furnace should preferably be one capable of rapid heating and cooling such as RTA apparatus with lamp heating. For batchwise operation, the heat treatment furnace should have a small heat capacity and be provided with forced cooling mechanism.

The isothermal heat treatment maintains a constant temperature of $T_1$ for a prescribed period of time t as shown in FIG. 4. This stage is followed by rapid cooling from $T_1$ to $T_0$ at a predetermined cooling rate ($\Delta T/min$) as shown in FIG. 4. These parameters $T_1$, t, and $\Delta T/min$ control the injection and concentration of dissolved oxygen. During isothermal heat treatment, the diluted oxygen gas may be varied in concentration with time so that the distribution of dissolved oxygen varies in the surface layer of the silicon wafer as desired.

The foregoing procedure causes dissolved oxygen 14 to be introduced into the outer part of the DZ layer 12 of the anneal wafer or the outer part of the silicon epitaxial layer 22 of the silicon epitaxial wafer, as shown in FIGS. 1A and 1B, with the concentration and distribution of dissolved oxygen properly controlled.

Heating from room temperature to $T_1$ should be performed at a heating rate low enough for defects (such as slips) not to occur in the wafer. This step may be accomplished in an atmosphere of either inert gas or oxygen-containing gas.

The isothermal heat treatment slightly oxidizes the surface of the wafer which is exposed to the oxidizing gas. The slightly oxidized surface prevents the injection and freezing of lattice vacancies into the surface layer of the wafer in the ensuing stage of rapid cooling.

The isothermal heating and rapid cooling in an oxygen-containing atmosphere requires that the temperature ($T_1$) for isothermal heating be in the range of 1000° C. to 1300° C., the temperature ($T_0$) be in the range of 700° C. to 900° C., the holding time (t) be in the range of a few seconds to tens of minutes, the cooling rate ($\Delta T/min$) be in the range of 10° C./min to 100° C./min, and the concentration of dissolved oxygen introduced into the wafer's surface layer be in the range of $1 \times 10^{17}$ atoms/cm$^3$ to $1 \times 10^{18}$ atoms/cm$^3$.

The dissolved oxygen 14 increases in concentration in proportion to the heat treatment temperature $T_1$ and the holding time t. With a low cooling rate ($\Delta T/min$), the dissolved oxygen 14 is distributed such that its concentration monotonously increases inward from the wafer's surface, as indicated by the solid line (b) in FIG. 2. Conversely, with a high cooling rate ($\Delta T/min$), the dissolved oxygen 14 is distributed such that its concentration reaches a minimum or a maximum in the wafer's surface layer, as indicated by the solid lines (a) and (c) in FIG. 2. The difference between the solid lines (a) and (c) lies in the temperature $T_1$ for isothermal heat treatment. The solid lines (a) and (c) represent heat treatment at 1000° C. and 1200° C., respectively.

Cooling at a cooling rate ($\Delta T/min$) greater than 100° C./min causes slip to easily occur in the wafer. Therefore, control to reduce temperature difference in the wafer is necessary.

(2) Method for Switching Oxygen Gas During Preparation of Anneal Wafer

Figure 5:
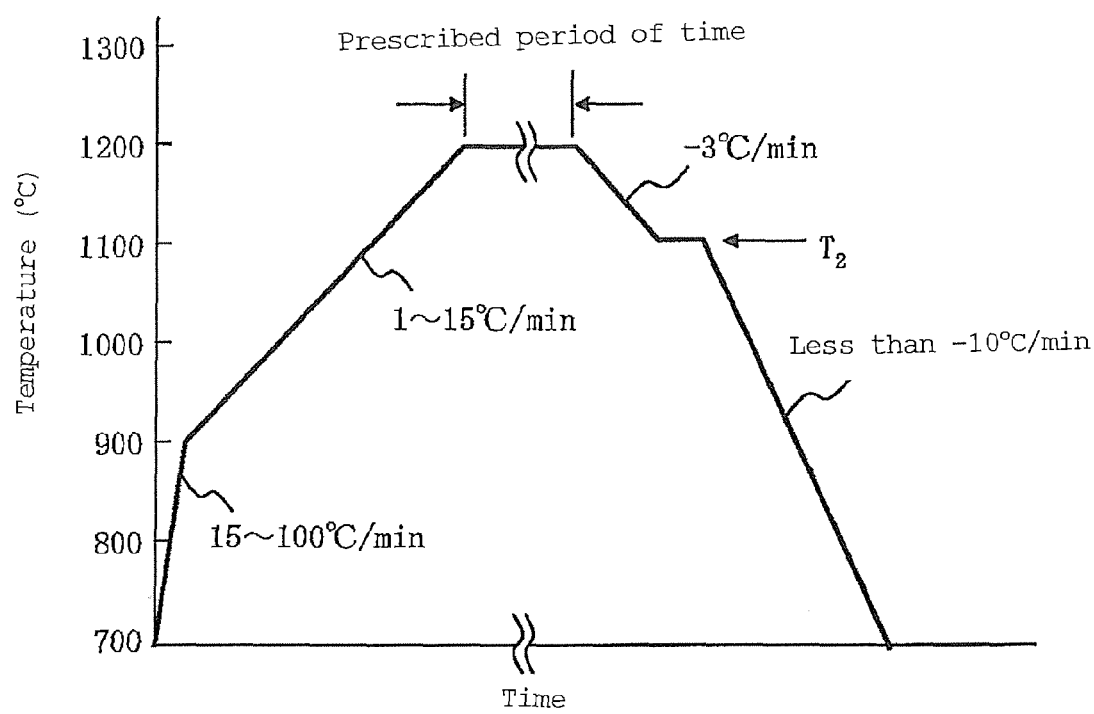
FIG. 5 is a diagram showing one example of the heat temperature intended for continuous process of anneal wafer preparation and dissolved oxygen injection according to the embodiment of the present invention.

This method illustrated in FIG. 5 is intended for continuous process of anneal wafer preparation and dissolved oxygen injection. The raw silicon wafer for this process is one which is pulled and grown by CZ method, with its one side or both sides mirror-finished. It contains oxygen in crystals such that the concentration of interstitial oxygen (Oi) is 1.0 to $1.8 \times 10^{18}$ atoms/cm³.

The process starts with placing a large number of raw silicon wafers in a heat treatment furnace such as horizontal or vertical diffusion furnace in the same way as explained above for preparation of anneal wafers. For preparation of anneal wafers, the heat treatment furnace is filled with an atmosphere of rare gas such as argon, and heat treatment is carried out according to an adequate heating, holding, and cooling schemes.

The heat treatment is carried out according to the temperature profile shown in FIG. 5. The temperature is raised from room temperature to 900° C. at a rate of 5 to 100° C./min. The temperature is further raised from 900° C. to 1200° C. at a rate of 1 to 15° C./min. The temperature is kept constant at 1100° C. to 1300° C. Heating in the first embodiment causes BMD to diminish and disappear and forms precipitating nuclei. Heating in the second embodiment causes BMD to grow in the bulk and to cause oxygen to diffuse outward in the surface layer.

Then the silicon wafer is kept at 1100° C. to 1300° C. for a prescribed period of time. This step causes more oxygen to diffuse outward in the surface layer and also causes BMD to disappear. Thus there is obtained the DZ layer with high crystallinity, with residual grown-in defects (aggregates of lattice vacancies) disappeared in the surface layer.

Cooling is carried out in two stages. In the first stage, the temperature is lowered to $T_2$ at a cooling rate of 3° C./min or less. At the temperature $T_2$, the rare gas (such as argon) is switched to an oxygen-containing gas for injection of dissolved oxygen. The oxygen-containing gas may be 100% oxygen or any gas containing oxygen. The temperature $T_2$ is kept for a prescribed period of time. Then cooling down to 700° C. is continued at a rate of 10° C./min or more. During this cooling stage, the atmosphere of oxygen-containing gas is maintained.

What is important for injection of dissolved oxygen is the temperature at which the gas is switched. This temperature ranges from 1100° C. to 1300° C. As the gas switching temperature rises, the concentration of dissolved oxygen increases accordingly in the surface layer of the wafer. However, the holding time has very little effect even though it changes from 0 to 20 minutes. If the cooling rate is 10° C./min and the gas switching temperature $T_2$ is 1100° C., the holding time should be 5 minutes or longer so that the concentration of oxygen is higher than $1 \times 10^{17}$ atoms/cm³ in the surface layer of the wafer. If the gas switching temperature $T_2$ is higher than 1150° C., the holding time may be omitted; in this case the concentration of oxygen is higher than $1 \times 10^{17}$ atoms/cm³ in the surface layer of the wafer. In the case where the atmosphere is an oxygen-containing gas, as rapid cooling as available for the horizontal or vertical furnace may be permissible as explained above for isothermal heat treatment and rapid temperature rise heat treatment.

Incidentally, the method for injection and concentration control of dissolved oxygen, which has been mentioned above in sections (1) and (2), is applicable to introduction of dissolved oxygen into the surface part of the DZ layer of the anneal wafer or the surface part of the silicon epitaxial layer by heat treatment, followed by rapid cooling, in an atmosphere of oxygen-containing gas.

(3) Method for Introduction of Oxygen Ions

The DZ layer 12a of the anneal wafer or the silicon epitaxial layer 22 of the silicon epitaxial wafer, both shown in FIG. 1, undergoes injection of oxygen ions into its surface. The dose of oxygen ions ranges from $10^{11}$ to $10^{13}$ ions/cm², and the energy for injection ranges from 50 to 500 keV. With the dose and energy varied in terms of time, it is possible to control the concentration of dissolved oxygen 14 in the depth-wise direction of the wafer. After injection of oxygen ions, the wafer may undergo RTA at about 1100° C. or annealing at about 900° C. in a heat treatment furnace, so that injected oxygen changes into dissolved interstitial oxygen.

(4) Other Methods

There is another method other than mentioned above for injection of dissolved oxygen into the DZ layer of the anneal wafer or the silicon epitaxial layer of the silicon epitaxial wafer. It is plasma doping of oxygen. According to the method, the wafer is exposed to oxygen plasma, which has been generated in a container, for a predetermined period of time. Plasma excitation occurs in oxygen gas at a reduced pressure in a container, and oxygen ions in the oxygen plasma are injected into the wafer surface. This step is followed by RTA at about 1100° C. and annealing at about 900° C. in a heat treatment furnace, so that injected oxygen ions are dissolved in the form of interstitial oxygen.

According to this embodiment, the anneal wafer or silicon epitaxial wafer undergoes the foregoing step before its device fabrication process, so that an adequate amount of oxygen is dissolved in the surface of the wafer, with the concentration and distribution of dissolved oxygen properly controlled. In this way there is obtained invariably the silicon wafer which has good crystallinity and high stress resistance in its surface layer and is highly capable of gettering metal contaminants in its inside. Moreover, this silicon wafer has its own characteristics free from the heat history it experiences during the production of single crystal by CZ method or MCZ method or during its device fabrication process.

The above-mentioned silicone wafer, which is either anneal wafer or silicon epitaxial wafer, easily prevents the occurrence and propagation of defects, such as dislocations, in the surface layer thereof even though it undergoes fabrication of semiconductor devices (with finer structure and higher stress) at a lower temperature in a shorter time. Thus the silicon wafer according to the embodiment of the present invention will permit the production of semiconductor devices with a design rule smaller than 32 nm, which is highly integrated, highly functional, and capable of high performance, while keeping good yields.

EXAMPLES

The following examples demonstrate the effect of the present invention, although they are not intended to restrict the scope of the present invention. Processing in the examples was performed on an 8-inch silicon wafer sliced from a single-crystal silicon ingot pulled and grown by the CZ method. The raw silicon wafer had the initial concentration of interstitial oxygen (Oi) of $1.4 \times 10^{18}$ atoms/cm³. The raw silicon wafer was made into an anneal wafer, which subsequently underwent injection of dissolved oxygen into its surface layer. The concentration of oxygen in the silicon wafer was determined by secondary ion mass spectrometry (SIMS) in the stage of preparing the anneal wafer and the stage that follows injection of dissolved oxygen, and the depth of the DZ layer and the amount of BMD were measured by infrared scattering tomography.

Example 1

An anneal wafer was prepared, and then it underwent heat treatment by isothermal heating and rapid heating to a high temperature for injection of dissolved oxygen into its surface layer, with the concentration of dissolved oxygen properly controlled. The heat treatment to prepare the anneal wafer was carried out at normal heating and cooling rates in an atmosphere of hydrogen gas, with the heating temperature maintained at 1200° C. for 1 hour. The thus prepared anneal wafer (which will be referred to as hydrogen anneal wafer) underwent injection of dissolved oxygen into its surface layer in a sheet-fed RTA apparatus under the following conditions.

Figure 6:
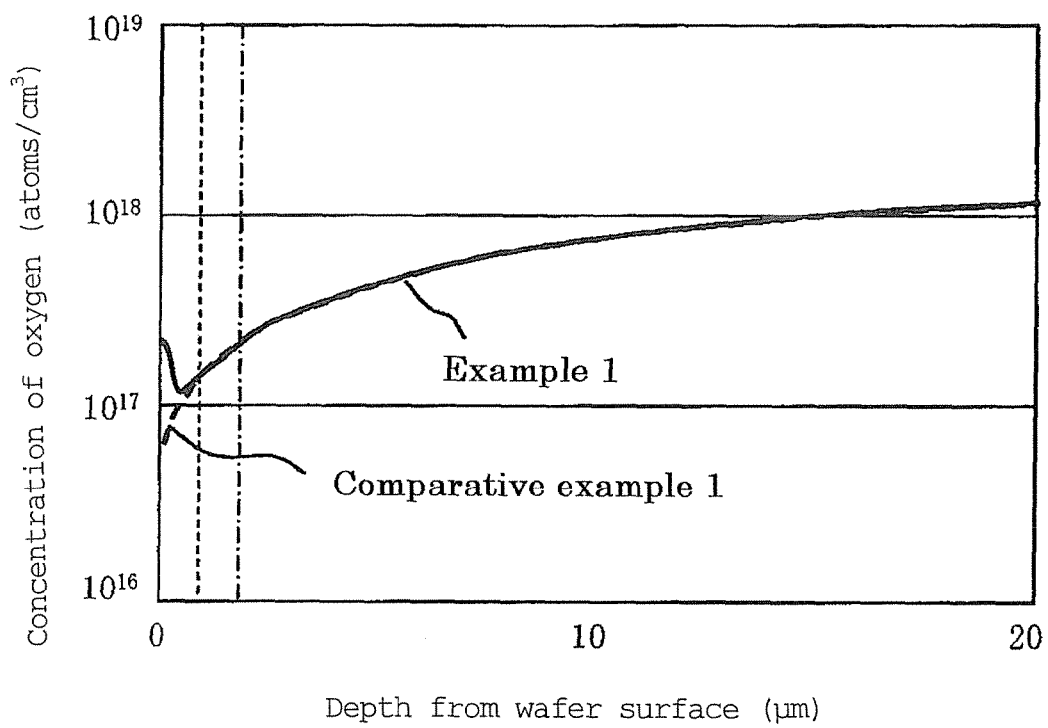
FIG. 6 is a graph showing the depthwise distribution of oxygen concentration in the silicon wafer according to Example 1 of the present invention.

Atmosphere: dry oxygen gas
Isothermal heating temperature $T_1$: 1100° C.
Holding time t: 0.5 minutes
Cooling rate ($\Delta T$/min) between $T_1$ and $T_0$ (700° C.): 100° C./min FIG. 6 shows the depthwise distribution of oxygen concentration in the silicon wafer. The solid line denotes the distribution of concentration in the silicon wafer according to Example 1, in which dissolved oxygen was injected into the surface layer of the anneal wafer mentioned above. The broken line denotes the distribution of concentration in the hydrogen anneal wafer according to Comparative Example 1. Incidentally, the wafer had its silicon oxide film removed from its surface.

It is noted from FIG. 6 that the wafer according to Example 1 has the minimum oxygen concentration in the region from its surface to a depth of 1 μm (indicated by the dotted line). This minimum value is a little over $1 \times 10^{17}$ atoms/cm$^3$, and the concentration near the outermost surface of the wafer is approximately $2 \times 10^{17}$ atoms/cm$^3$. The oxygen concentration monotonously increases in the region from a depth of 2 μm (indicated by the chain line) to a depth of 20 μm from the wafer surface, and it reaches about $1.2 \times 10^{18}$ atoms/cm$^3$ in the bulk.

In the case of hydrogen anneal wafer according to Comparative Example 1, the oxygen concentration is approximately $6 \times 10^{16}$ atoms/cm$^3$ in the vicinity of the wafer surface, and it monotonously increases in the region from the wafer surface to a depth of 1 μm, as in Example 1, and reaches about $1.2 \times 10^{18}$ atoms/cm$^3$ in the bulk.

The depth of the DZ layer is 11.4 μm in both Example 1 and Comparative Example 1. The amount of BMD in the DZ layer is less than the limit of detection by infrared scattering tomography ($10^7$ pieces/cm$^3$). The amount of BMD in the bulk is about $1.7 \times 10^9$ pieces/cm$^3$ in both Example 1 and Comparative Example 1.

Example 2

An anneal wafer was prepared, and the preparing process was immediately followed by injection of dissolved oxygen into its surface layer by switching the atmospheric gas. Heat treatment to prepare the anneal wafer was carried out in an atmospheric gas of argon, with the holding temperature being 1200° C. and the holding time being 0.5 hours. The heating process is a normal one. With the temperature kept at 1200° C., argon was switched to dry oxygen gas, and the same temperature was maintained for 5 minutes. With the atmospheric gas switched to dry oxygen gas, the temperature was lowered to 700° C. at a cooling rate of 5° C./min. For Comparative Example 2, the same procedure as mentioned above was repeated except that argon was not switched to dry oxygen gas during heat treatment. The resulting anneal wafer is referred to as argon anneal wafer.

Figure 7:
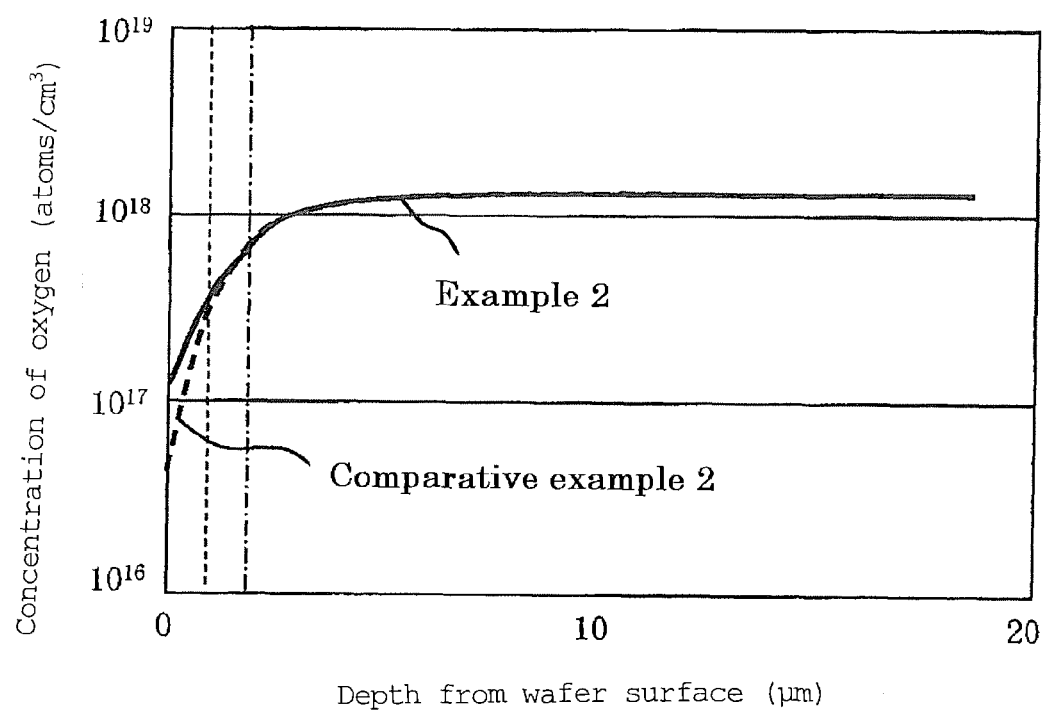
FIG. 7 is a graph showing the depthwise distribution of oxygen concentration in the silicon wafer according to Example 2 of the present invention.

FIG. 7 shows the depthwise distribution of oxygen concentration in the silicon wafer. The solid line denotes the distribution of concentration in the silicon wafer according to Example 2. The broken line denotes the distribution of concentration in the argon anneal wafer according to Comparative Example 2. Incidentally, the wafer had its silicon oxide film removed from its surface.

It is noted from FIG. 7 that the wafer according to Example 2 has the oxygen concentration which sharply decreases in the region from the wafer surface to a depth of 2 μm (indicated by the chain line). The oxygen concentration is approximately $1.3 \times 10^{17}$ atoms/cm$^3$ in the vicinity of the wafer surface, and it monotonously increases in the region having a depth of 2~20 μm from the wafer surface and reaches about $1.3 \times 10^{18}$ atoms/cm$^3$ in the bulk.

In the case of argon anneal wafer according to Comparative Example 2, the oxygen concentration decreases in the region from a depth of 2 μm (indicated by the chain line), as in the case of Example 2, and then more sharply decreases in the region from a depth of 1 μm (indicated by the dotted line) to the wafer surface than in the case of Example 2. The oxygen concentration is $5.2 \times 10^{17}$ atoms/cm$^3$ in the vicinity of the wafer surface. It monotonously increases in the region having a depth of 2~20 μm from the wafer surface, as in Example 2, and reaches about $1.3 \times 10^{18}$ atoms/cm$^3$ in the bulk.

The depth of the DZ layer is about 10 μm in both Example 2 and Comparative Example 2. The amount of BMD in the DZ layer is less than $2.5 \times 10^7$ pieces/cm$^3$ and the amount of BMD in the bulk is about $5 \times 10^8$ pieces/cm$^3$ in both Example 2 and Comparative Example 2.

It has been proved from the foregoing examples that an adequate amount of dissolved oxygen can be injected simply and effectively into the surface layer of the anneal wafer, with the distribution of concentration controlled as desired. The silicon wafer having dissolved oxygen injected therein was examined for propagation of dislocations formed in its surface. The results showed that the surface layer as the device active region exhibits high stress resistance.

The invention has been described in its preferred form of Embodiments and Examples, which are not intended to restrict the scope thereof. It is to be understood that various changes and modifications may be made in the invention by those skilled in the art without departing from the sprit and scope thereof.

In the foregoing examples, the anneal wafer was prepared by using a rare gas as the atmospheric gas which was switched to oxygen gas later. However, almost the same procedure as above may be used in the case where hydrogen is used as the atmospheric gas. In this case, it is desirable to replace hydrogen gas with rare gas at the gas switching temperature before switching to the oxygen-containing gas.

The silicon wafer for the present invention is not limited by its diameter, resistivity, and conduction type. It may be an SOI (silicon on insulator) wafer.

Incidentally, the concentration of interstitial oxygen (Oi) used in this specification is based on the conversion factor according to Old ASTM.

What is claimed is:

1. A method of processing a silicon wafer formed from a single-crystal silicon ingot grown by pulling, the method comprising:
    (A) diffusing oxygen outward from a surface layer of the silicon wafer by heat-treating the silicon wafer in a reducing gas or inert gas or a mixture thereof; and
    (B) injecting dissolved oxygen to the surface of the silicon wafer by further heating-treating the silicon wafer and subsequently rapid-cooling the silicon wafer in an oxygen-containing gas,
    wherein said (B) comprises isothermal heat treatment in the oxygen-containing gas and subsequent rapid cooling in the oxygen-containing gas in a rapid-heating-andcooling apparatus, and wherein said rapid-cooling has a cooling rate that ranges from 10° C/min to 100° C/min, wherein the silicon wafer after being processed in steps (A) and (B), comprises:

a denuded zone (DZ) layer formed adjacent a surface of the silicon wafer and having a dissolved oxygen density of about $1\times10^{17}$ atoms/cm$^3$ to about $1\times10^{18}$ atoms/cm$^3$; and a bulk layer having bulk micro defects (BMD) density of about $5\times10^8$ pieces/cm$^3$ to about $5\times10^9$ pieces/cm$^3$.

2. The method of claim 1, wherein the BMD density is no higher than $2.5\times10^7$ pieces/cm$^3$ in a region of the silicon wafer from the surface to a depth of 2 μm.

3. The method of claim 1, wherein the concentration of dissolved oxygen has a range of 1.2 to $6.0\times10^{17}$ atoms/cm$^3$ in the region from the surface to a depth of 2μm of the silicon wafer.

4. The method of claim 1, wherein the concentration of dissolved oxygen has a range of 2.8 to $5.2\times10^{17}$ atoms/cm$^3$ in the region from the surface to a depth of 9μm of the silicon wafer.

5. The method of claim 1, wherein the inert gas comprises at least one of nitrogen or argon.

6. The method of claim 1, wherein the reducing gas comprises hydrogen.

* * * * *